(12) United States Patent
Shindo et al.

(10) Patent No.: US 8,359,761 B2
(45) Date of Patent: Jan. 29, 2013

(54) MEASURING EQUIPMENT AND METHOD FOR FORMING LAMINATED BODY

(75) Inventors: Hiroyuki Shindo, Kasugai (JP); Toyohiko Asai, Kasugai (JP)

(73) Assignees: NGK Insulators, Ltd., Nagoya (JP); NGK Ceramic Device Co., Ltd., Komaki (JP)

( * ) Notice: Subject to any disclaimer, the term of this patent is extended or adjusted under 35 U.S.C. 154(b) by 289 days.

(21) Appl. No.: 12/907,130

(22) Filed: Oct. 19, 2010

(65) Prior Publication Data

US 2011/0100523 A1 May 5, 2011

(30) Foreign Application Priority Data

Oct. 30, 2009 (JP) .................................. 2009-249706

(51) Int. Cl.
*G01B 3/14* (2006.01)
*G01B 5/207* (2006.01)

(52) U.S. Cl. ...................................... 33/552; 33/501.02

(58) Field of Classification Search .................... 33/552, 33/501.07, 551, 555–561, 501.02
See application file for complete search history.

(56) References Cited

U.S. PATENT DOCUMENTS

| | | | | |
|---|---|---|---|---|
| 2,676,412 A * | 4/1954 | Griffin | | 33/501.04 |
| 4,060,734 A * | 11/1977 | Tilley et al. | | 33/501.03 |
| 4,271,699 A * | 6/1981 | Williamson | | 33/501.02 |
| 4,777,729 A * | 10/1988 | Hausler | | 33/501.03 |
| 4,805,310 A * | 2/1989 | Fernand | | 33/832 |
| 5,811,701 A * | 9/1998 | Lee | | 73/866.5 |
| 5,822,877 A * | 10/1998 | Dai | | 33/560 |
| 6,101,700 A * | 8/2000 | Powell et al. | | 33/554 |
| 6,701,633 B2 * | 3/2004 | Ohtsuka | | 33/552 |
| 6,725,557 B2 * | 4/2004 | Kushibiki et al. | | 33/555 |
| 6,891,612 B1 | 5/2005 | Koike et al. | | |
| 6,907,672 B2 * | 6/2005 | Said | | 33/552 |
| 7,047,657 B2 * | 5/2006 | Goeggelmann et al. | | 33/552 |
| 7,243,441 B2 * | 7/2007 | Watanabe et al. | | 33/836 |
| 2002/0148130 A1 * | 10/2002 | Ohtsuka | | 33/552 |
| 2003/0009894 A1 * | 1/2003 | Yamamoto | | 33/501.02 |
| 2011/0100523 A1 * | 5/2011 | Shindo et al. | | 156/64 |

FOREIGN PATENT DOCUMENTS

| | | | |
|---|---|---|---|
| JP | 61-013105 A1 | 1/1986 | |
| JP | 07-088820 A1 | 4/1995 | |
| JP | 09-005041 A1 | 1/1997 | |
| JP | 10-160447 A1 | 6/1998 | |
| JP | 11-271005 A1 | 10/1999 | |
| JP | 11-326239 A1 | 11/1999 | |
| JP | 2002-213903 A1 | 7/2002 | |
| JP | 2006-153732 A1 | 6/2006 | |
| JP | 2006-292584 A1 | 10/2006 | |

* cited by examiner

*Primary Examiner* — Yaritza Guadalupe-McCall
(74) *Attorney, Agent, or Firm* — Burr & Brown

(57) ABSTRACT

A method for improving an accuracy of measurement of the thickness of a green sheet, and additionally improving yield of a green sheet used for formation of a laminated body is provided. The thickness of each of a plurality of ceramic green sheets is measured, and an average and a variation of obtained thickness measurement values are checked against predetermined ranking criteria. Thereby, a ranking is performed in which the plurality of ceramic green sheets are classified into a plurality of ranks set in the ranking criteria. When forming the laminated body, only a ceramic green sheet belonging to at least one of the ranks which is in advance allowed to be used is used as a ceramic green sheet constituting each layer of the laminated body.

10 Claims, 6 Drawing Sheets

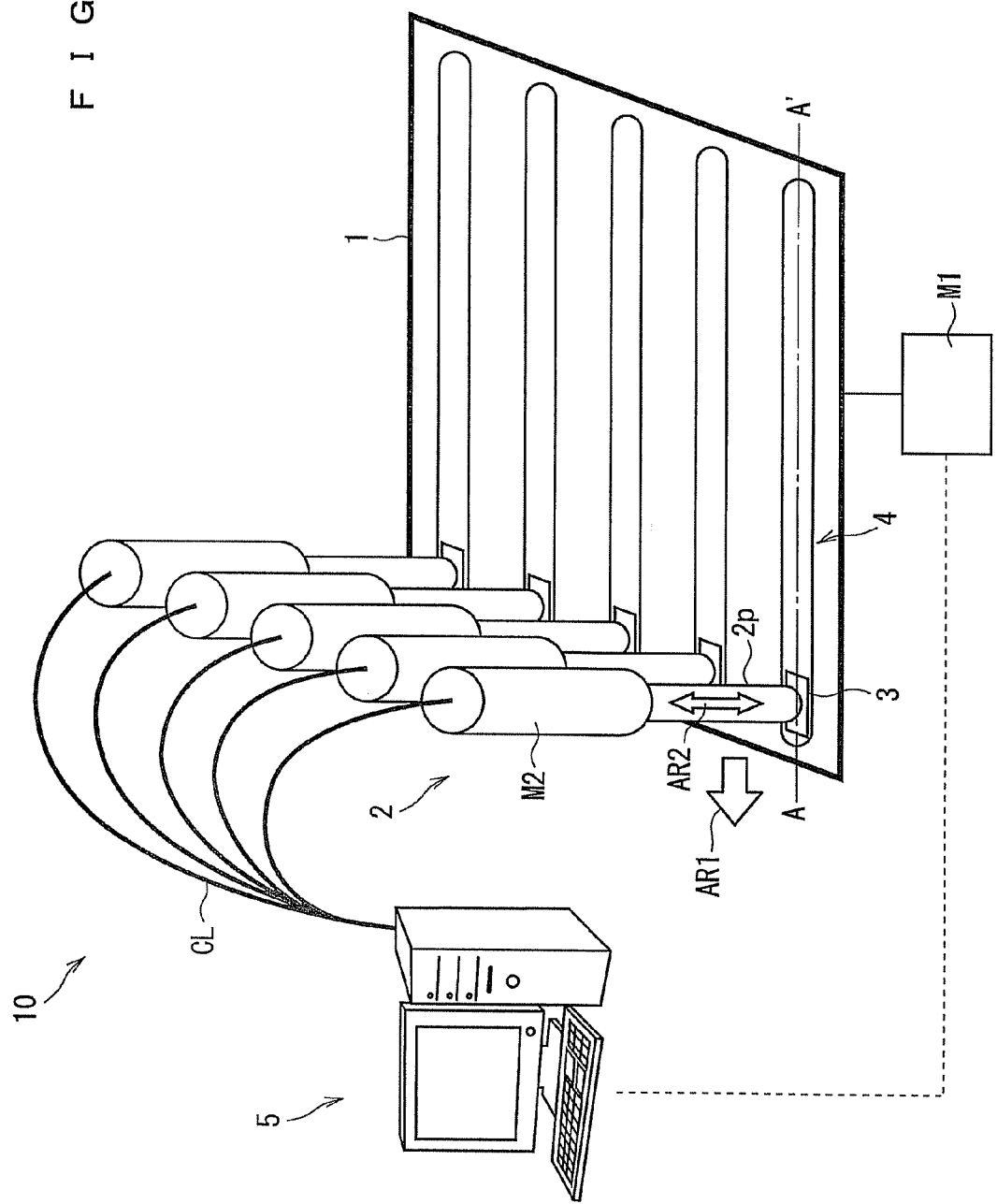

FIG. 4

| RANK | SHEET THICKNESS MEASUREMENT RESULT | |
|---|---|---|
| | AVERAGE VALUE ($\mu$m) | VARIATION ($\mu$m) |
| A | 245.0~255.0 | ~5.0 |
| B | 245.0~255.0 | 5.1~10.0 |
| C | 255.1~265.0 | ~5.0 |
| D | 255.1~265.0 | 5.1~10.0 |
| E | 265.1~275.0 | ~5.0 |
| F | 265.1~275.0 | 5.1~10.0 |

FIG. 5

| LAYER | SHEET RANK ALLOWED TO BE USED | POSSIBLE THICKNESS VALUE OF LAMINATED SHEET ($\mu$m) |
|---|---|---|
| 1ST LAYER | A | 240.0~260.0 |
| 2ND LAYER | F, E | 255.1~285.1 |
| 3RD LAYER | C | 250.1~270.0 |
| 4TH LAYER | D, C | 245.1~275.0 |
| 5TH LAYER | E | 260.1~280.0 |
| 6TH LAYER | B, A | 235.0~265.0 |
| LAMINATED BODY | SUM OF MINIMUM VALUES TO SUM OF MAXIMUM VALUES | 1485.4~1635.0 |
| | ERROR RANGE | -5%~+4.8% |

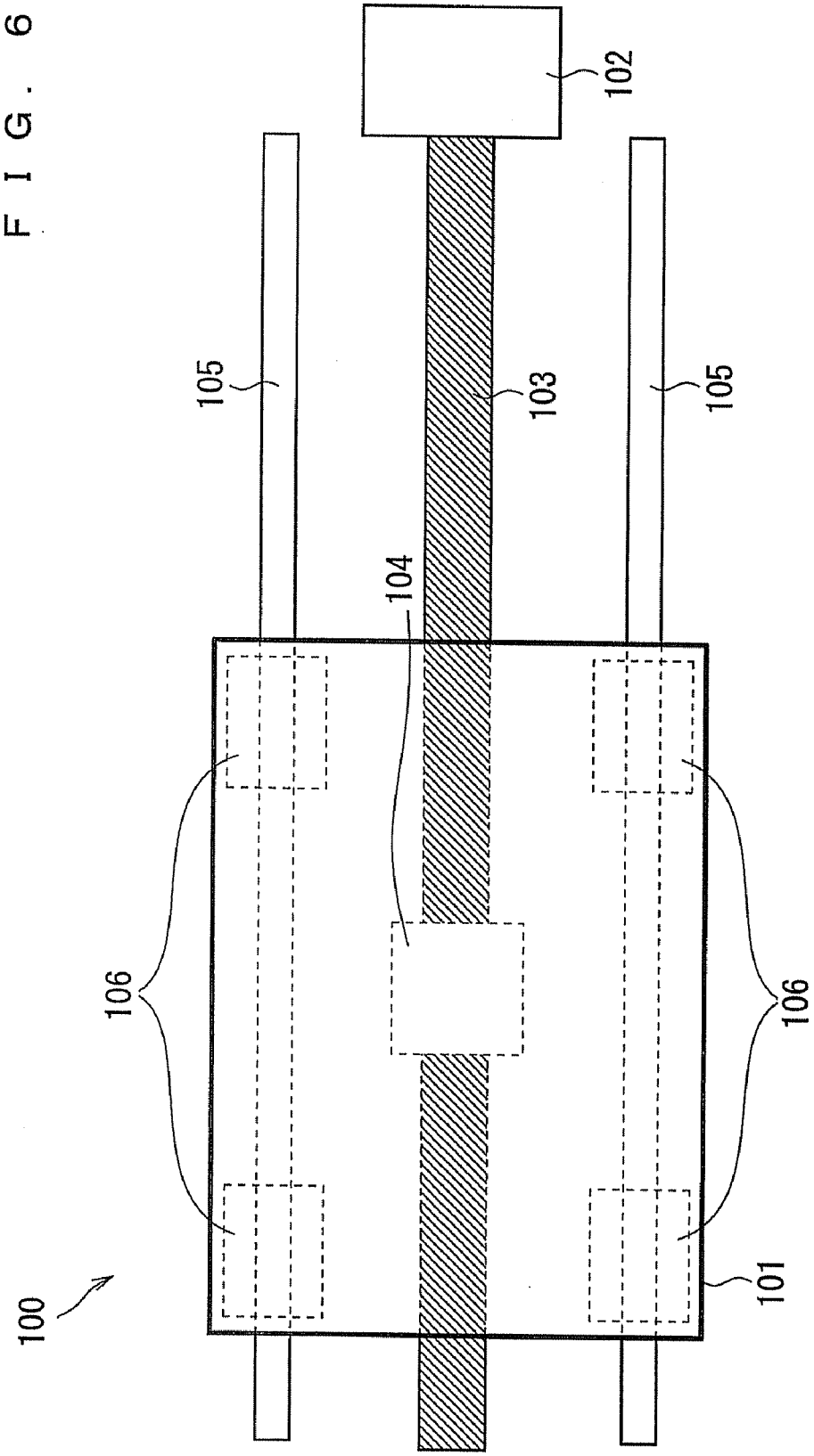

MEASURING EQUIPMENT AND METHOD FOR FORMING LAMINATED BODY

BACKGROUND OF THE INVENTION

1. Field of the Invention

The present invention relates to formation of a laminated body of ceramic green sheets.

2. Description of the Background Art

As a method for preparing various devices including a sensor element of a gas sensor or the like, widely known is a method (green sheet process) in which: a plurality of ceramic green sheets (hereinafter, also simply referred to as green sheets) are prepared by applying a slurry, which is a mixture of a ceramic power and an organic substance, to predetermined films and then drying; a cavity or a predetermined circuit pattern is formed by screen printing or the like in each of the ceramic green sheets as needed; the ceramic green sheets are then laminated; and a laminated body thus obtained is sintered.

In the green sheet process, a product designing and the like are performed with an allowance for a change of the size which is caused by the contraction of the green sheets (more specifically, a laminated body of them) during the sintering. Therefore, to improve the yield of the product, a size control of the green sheet is important. Particularly, due to a manufacturing method of the green sheet, the thickness of the green sheet easily varies. Therefore, an improvement of the yield based on a thickness management has been demanded. For this purpose, it is necessary to measure the thickness with a high accuracy.

A method is already known in which the thickness of a green sheet is managed by measuring the weight of the green sheet to consequently control with a high accuracy the thickness of a ceramic layer included in a sintered body which is obtained using a plurality of the green sheets (for example, see Japanese Patent Application Laid-Open No. 7-088820).

In the method disclosed in Japanese Patent Application Laid-Open No. 7-088820, it is necessary to identify a functional relationship (or a standard curve) between the weight and the thickness about every kind of the green sheet in accordance with its composition and thickness. Additionally, each time the material of the green sheet or a preparing process is changed, the functional relationship has to be revised. These are complicated.

On the other hand, a method for directly measuring the thickness of a green sheet with a certain efficiency in a sense of the process management is as follows: the green sheet is placed on a predetermined stage, and then a measurement of the thickness is performed from the upper side of the stage by means of a contact type probe using a micro gauge or the like, or a noncontact type probe using a laser beam or the like. At that time, it is also possible to measure a plurality of positions of the green sheet, by intermittently or continuously performing the measurement while moving the stage.

FIG. 6 is a partial top view showing a measuring equipment 100 which performs a measurement in such a mode. FIGS. 7A to 7E are partial side views of the measuring equipment 100 in various modes.

The measuring equipment 100 includes a stage 101 having a plate-like shape in a top view. The stage 101 has, at a lower part thereof, a bearing 104 which is threadably engaged with a ball screw 103 rotated by a stepping motor 102, and also has, at four end portions in the lower part thereof, linear guides 106 guided by guide rails 105. As shown in FIG. 7A, a green sheet 107 is placed on the stage 101, and in this condition a probe 108p of a digital micro gauge 108 is brought into contact with the green sheet 107 from the upper side of the green sheet 107, to thereby measure the thickness of the green sheet 107. By repeatedly performing the measurement while intermittently moving the stage 101, the thickness can be measured at a plurality of positions of the green sheet 107.

However, this method has a problem that since the method involves a plurality of error causes such as a mechanical accuracy of a moving mechanism which moves the stage, the flatness of the stage, and the like, these error causes are superimposed on a variation of the thickness of the green sheet itself, and consequently an obtained measurement value is not always sufficiently reliable. For example, an error is caused in the measurement of the thickness, if the guide rail 105 is mounted with an insufficient horizontal accuracy as shown in FIGS. 7B and 7C, or if there is backlash in the linear guide 106 and therefore the stage 101 does not move exactly horizontally as shown in FIGS. 7D and 7E. Specifically, since an error of 2 to 3 µm easily occurs in each of the cases, even if a variation of the thickness of the green sheet itself is equal to or less than 10 µm, this cannot be accurately measured.

On the other hand, if a plurality of green sheets constituting the laminated body have different circuit arrangements or functions depending on the position in the lamination, a required thickness accuracy is not always the same among the lamination positions. For example, in a possible case, a green sheet used for one layer is required to have a thickness error of 1% or less in the sheet, while a green sheet used for another layer is allowed to have an error of up to 5%. In such a case, if the requirement of an error of 1% or less is applied to all the green sheets, the sheet preparation yield deteriorates.

SUMMARY OF THE INVENTION

The present invention relates to formation of a laminated body constituted by ceramic green sheets, and particularly is directed to an improvement in the yield of the ceramic green sheet used for the formation of the laminated body.

According to the present invention, an equipment which measures the thickness of a ceramic green sheet includes: a stage on which a ceramic green sheet is placed, and which has one or more openings; one or more measurement bases each arranged in each of the one or more openings; and one or more measuring elements which measure the thickness of the ceramic green sheet. The one or more measurement bases are fixedly provided independently of the stage. An upper surface of the one or more measurement bases is at substantially the same height as the stage. Each of the one or more measuring elements measures the thickness of the ceramic green sheet at a position thereof located above one of the one or more measurement bases in each of the one or more openings, the measurement being performed setting a height position of the measurement base as a reference position.

Preferably, in the measuring equipment of the present invention: the stage is provided so as to be movable along a predetermined movement direction by a drive mechanism; each of the one or more openings has a shape following the movement direction; and in each of the one or more openings, each of the one or more measuring elements repeatedly performs the measurement while the stage is intermittently or continuously moved along the movement direction, and thereby, measures the thickness of the ceramic green sheet at a plurality of positions thereof.

More preferably, the one or more openings comprise a plurality of openings, and the one or more measuring elements comprise a plurality of measuring elements each provided so as to correspond to each of the plurality of openings.

Accordingly, an accuracy of measurement of the thickness of the green sheet can be improved as compared with the conventional.

According to another aspect of the present invention, a method for forming a laminated body of ceramic green sheets includes the steps of: (a) setting ranking criteria for a ceramic green sheet, the ranking criteria defining a plurality of ranks based on an average thickness and a variation serving as reference values; (b) setting, from the plurality of ranks, a rank of a ceramic green sheet allowed to be used for each layer of the laminated body; (c) preparing a plurality of ceramic green sheets; (d) measuring the thickness of each of the plurality of ceramic green sheets, at a plurality of positions thereof; (e) classifying each of the plurality of ceramic green sheets into any of the plurality of ranks; (f) selecting, from the plurality of ceramic green sheets, a plurality of laminating ceramic green sheets which are used to constitute the layers of the laminated body; and (g) constituting the laminated body by using the plurality of laminating ceramic green sheets. In the step (e), each ceramic green sheet is classified by checking an average and a variation of thickness measurement values obtained in the step (d) against the ranking criteria. In the step (g), each of the plurality of laminating ceramic green sheets is selected from the plurality of ceramic green sheets classified in the step (e), in accordance with the setting of step (b).

Preferably, in the step (d), the thickness of each of the plurality of ceramic green sheets is measured at the plurality of positions thereof, by using the above-mentioned measuring equipment according to a preferred embodiment of the present invention.

Accordingly, the green sheet can be used for the formation of the laminated body at a high yield rate, without the need for a severe process control as required when green sheets constituting all the layers of the laminated body need the same accuracy.

Therefore, an object of the present invention is provide a measuring equipment which measures the thickness of a green sheet with a high accuracy, and a method for improving the yield of the green sheet used for the formation of the laminated body by using an accurate measurement value obtained by the measuring equipment.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 schematically shows a configuration of a measuring equipment 10 according to a preferred embodiment of the present invention;

FIG. 4 illustrates criteria of each of ranks used for a ranking;

FIG. 5 illustrates a rank of the green sheet S allowed to be used for each of first to sixth layers of the laminated body, and a range of a possible thickness of the green sheet S used;

FIG. 6 is a partial top view of a measuring equipment 100; and

DESCRIPTION OF THE PREFERRED EMBODIMENTS

Measuring Equipment

Figure 2A:
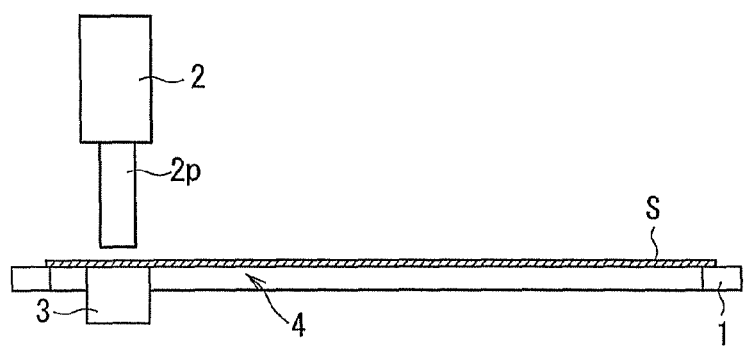
FIGS. 2A to 2D are cross-sectional views taken along the line A-A' of FIG. 1, each showing a measurement being performed by a digital micro gauge 2 of the measuring equipment 10.

FIG. 1 schematically shows a configuration of a measuring equipment 10 according to a preferred embodiment of the present invention. FIGS. 2A to 2D are cross-sectional views taken along the line A-A' of FIG. 1, each showing a measurement being performed by a digital micro gauge (hereinafter, also referred to as a digital gauge) 2 of the measuring equipment 10. The measuring equipment 10 is a device for measuring the thickness of a ceramic green sheet (green sheet) S which is used for manufacturing a device through a green sheet process.

The measuring equipment 10 mainly includes a stage 1 on which the green sheet S is placed, a plurality of digital gauges 2 of contact type, a plurality of measurement bases 3 each corresponding to each of the digital gauges 2, and a computer 5. The digital gauges 2 measure the thickness of the green sheet. The measurement bases 3 support measured portions of the green sheet S while the digital gauges 2 is performing a measurement. The computer 5 controls a movement operation of the stage 1 and a measurement process of the digital gauges 2, and also manages the green sheet S based on a measurement result. In FIG. 1, the measuring equipment 10 includes five digital gauges 2. However, this is merely illustrative, and the number of digital gauges 2 is not limited to five.

The stage 1 is movable in a direction of the arrow AR1 by a drive mechanism M1 controlled by the computer 5. In the stage 1, a plurality of openings 4 each having an elongated (slit-like) shape extending along the movement direction indicated by the arrow AR1 are formed so as to correspond to the respective digital gauges 2. In each of the openings 4, the measurement base 3 is fixedly provided independently of the stage 1. An upper surface of the measurement base 3 is at substantially the same height as an upper surface of the stage 1. More precisely, the measurement base 3 is provided in such a manner that when the stage 1 moves with the green sheet S placed thereon, the measurement base 3 does not interfere with the green sheet S and the stage 1.

The digital gauge 2 is connected to the computer 5 via a signal line CL, and a probe 2p of the digital gauge 2 can be extended and retracted in a direction of the arrow AR2 by the drive mechanism M2 which is controlled by the computer 5. The probe 2p of the digital gauge 2 is provided vertically above the measurement base 3, at the position of the opening 4 of the stage 1. The probe 2p is set such that a state where the probe 2p is in contact with the measurement base 3 is zero point.

Figure 2B:
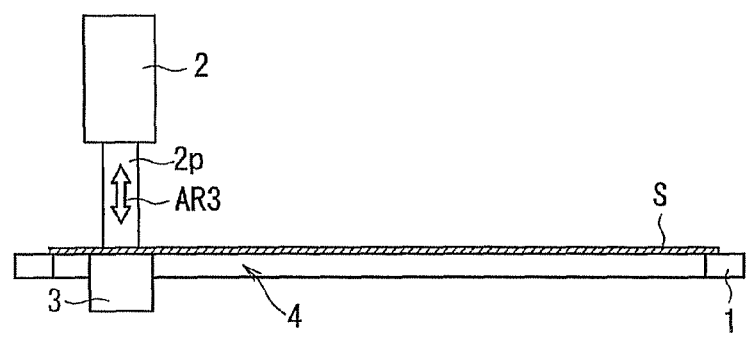

To measure the thickness of the green sheet S, firstly, the green sheet S is placed on the stage 1 in a state where the stage 1 is located such that the measurement base 3 is positioned at one end portion of the opening 4 as shown in FIG. 2A. After the green sheet S is placed, in response to a control signal from the computer 5, the digital gauge 2 moves the probe 2p up and down as indicated by the arrow AR3, as shown in FIG. 2B. At this time, in the opening 4, the green sheet S placed on the stage 1 is instantaneously pinched between the measurement base 3 immediately under the green sheet S and the digital gauge 2. Thereby, the digital gauge 2 measures the thickness of a pinched portion of the green sheet S. All the digital gauges 2 perform the measurement simultaneously. The measurement result is stored in the computer 5.

Figure 2C:
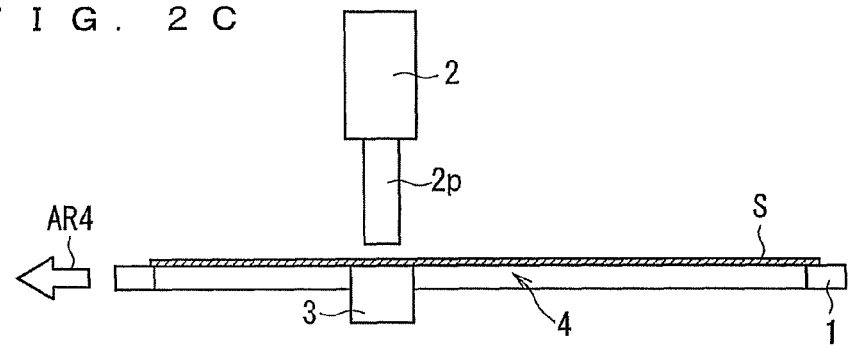
Figure 2D:
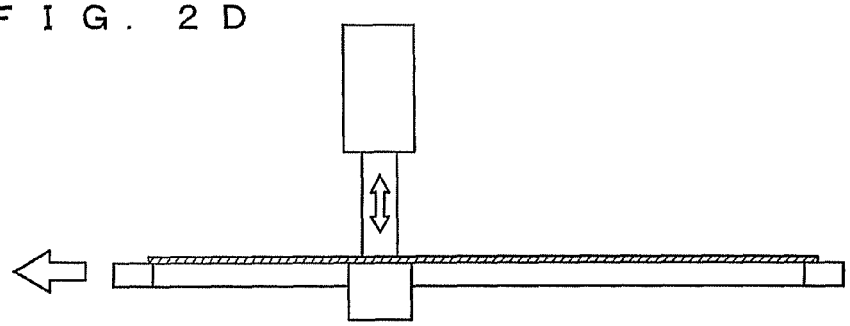

If the measurement of this portion is completed, then the stage 1 having the green sheet S placed thereon is moved by a predetermined distance in a direction of the arrow AR4 by the drive mechanism M1, as shown in FIG. 2C. After the movement, as shown in FIG. 2D, the measurement is performed again in the same manner as described above. Only the stage 1 having the green sheet S placed thereon is moved, and the digital gauge 2 and the measurement base 3 remain fixed. Consequently, the thickness is measured at a position of the green sheet S different from the previous position.

The plurality of digital gauges 2 repeatedly perform the above operation several times with respect to the movement direction of the stage 1. Thereby, the thickness of the green sheet S can be measured at a plurality of in-plane positions of the green sheet S. For example, in the case that five digital gauges 2 are provided as shown in FIG. 1, if each of the digital gauges 2 performs the measurement at five positions, 25 positions in total can be measured. Since the opening 4 is provided so as to extend along the movement direction of the stage 1, the measurement can be performed at any position within the range of the opening 4.

When a measurement is performed by the measuring equipment 10, in spite of a difference of measured positions in the green sheet S, a combination of the digital gauge 2 and the measurement base 3 used in the measurement is the same, and additionally they remain fixed at the same position. Thus, the measurement accuracy of each individual digital gauge 2 is always kept constant. Therefore, a measurement value with a higher reliability than the conventional can be obtained.

That is, by using the measuring equipment according to this preferred embodiment, the accuracy of measurement of the thickness of the green sheet can be improved as compared with the conventional. For example, since a measurement accuracy of approximately submicron order is realized, a thickness variation can be exactly evaluated if the variation is approximately 1 μm.

Lamination of Green Sheets

Next, an efficient method for laminating the green sheets to form a laminated body will be described. This method can be performed in an effective manner only when the high-accuracy thickness measurement using the above-described measuring equipment 10 can be applied. Here, a case where a sensor element for a gas sensor is fabricated using a green sheet S of solid electrolyte ceramic will be described as an example. It is assumed that the measuring equipment 10 is capable of a measurement of up to 0.1 micron.

For simplification of the description, it is assumed that the same target thickness (thickness to be obtained) of 255.0 μm is applied to all of the green sheets used for the formation of the respective layers of the laminated body, and the number of layers is six.

Figure 3:
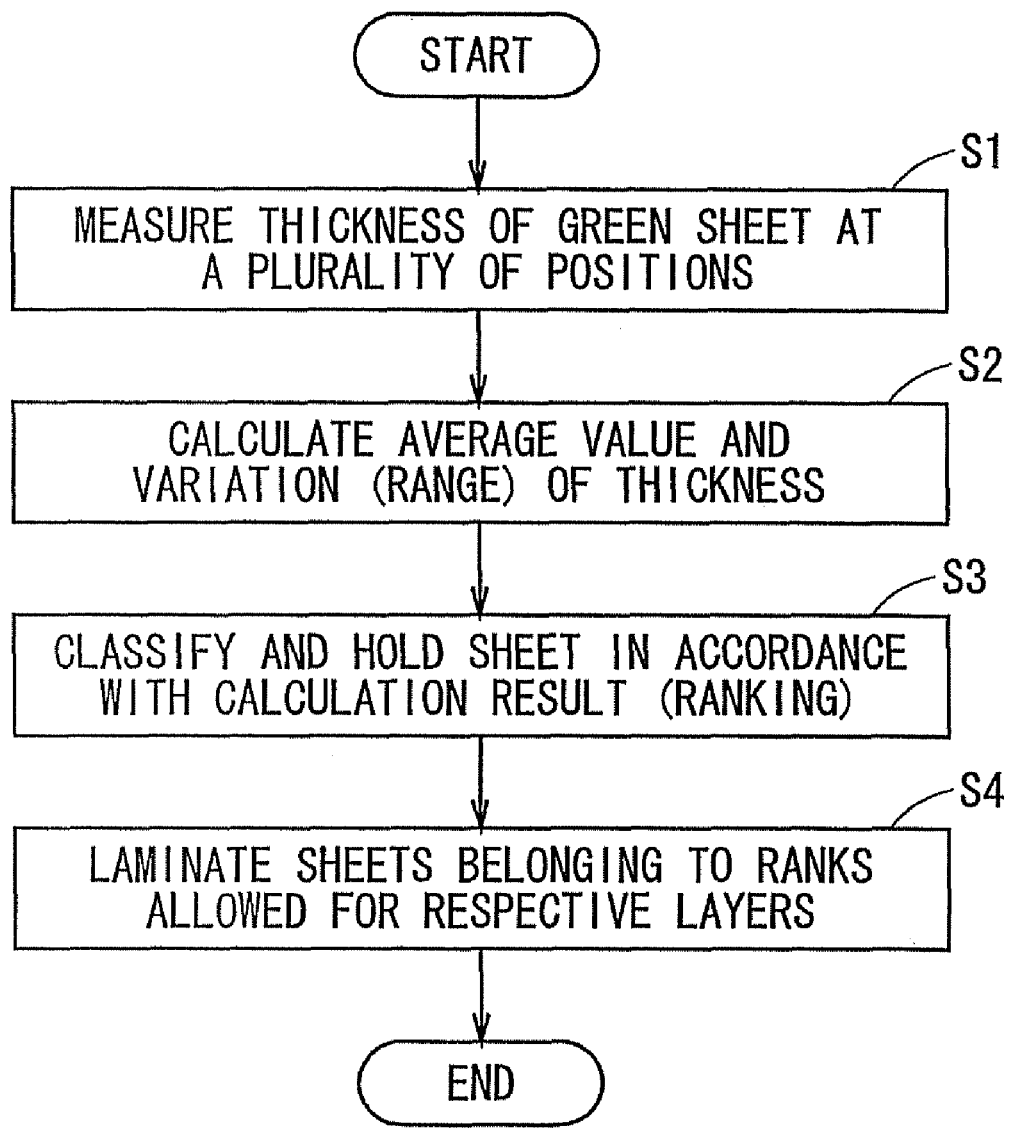
FIG. 3 shows an outline of a flow of a process performed on a green sheet S for forming a laminated body according to this preferred embodiment.
Figure 7A:
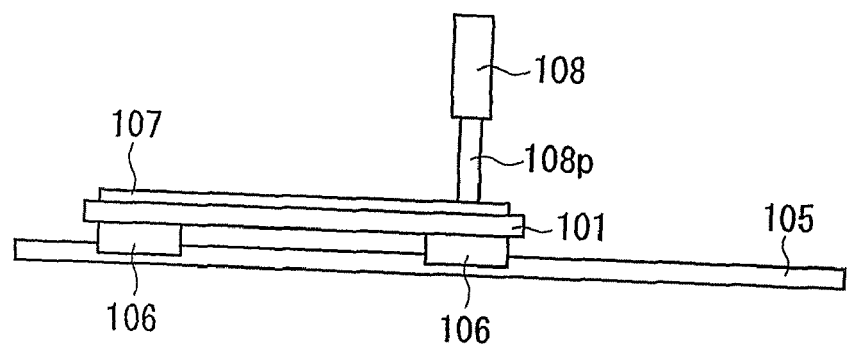
FIGS. 7A to 7E are partial side views of the measuring equipment 100 in various modes.
Figure 7B:
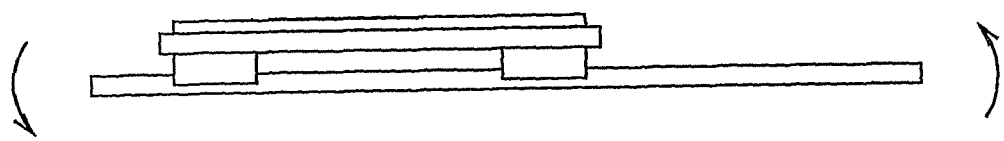
Figure 7C:
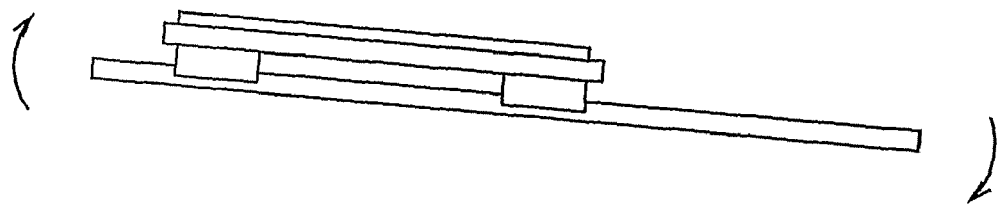
Figure 7D:
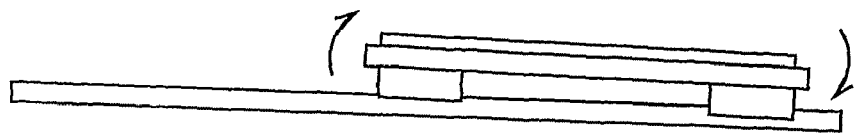
Figure 7E:
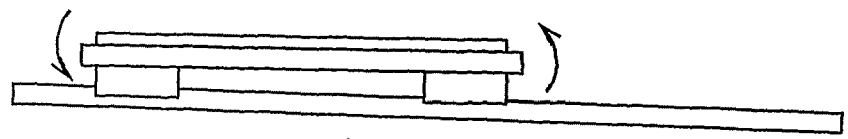

FIG. 3 shows an outline of a flow of a process performed on the green sheet S for forming the laminated body according to this preferred embodiment.

Firstly, using the above-described measuring equipment 10, a thickness measurement at a plurality of positions is sequentially performed on many green sheets S (step S1).

The measuring equipment 10 stores a measurement result for each green sheet S in a storage section of the computer 5, and calculates an average value and a variation of the thickness of each green sheet S (step S2). Here, in this preferred embodiment, the variation of the thickness of the green sheet S means a difference (range) between the maximum value and the minimum value.

After a result of the calculation of the average value and the variation is obtained, then the calculation result is checked against predetermined criteria, and a ranking is performed for classifying and storing the green sheet S in accordance with the result of checking (step S3).

FIG. 4 illustrates criteria of each of ranks used for the ranking. In an example shown in FIG. 4, the green sheet S is classified based on the average value into three levels of 245 μm to 255 μm, 255.1 μm to 265.0 μm, and 265.1 μm to 275.0 μm, and each of the three levels is classified based on the variation into two levels of 5.0 μm or less and 5.1 μm to 10.0 μm. Thereby, the green sheet S is classified into any one of six ranks of A rank to F rank, and stored. In this case, the green sheet classified into the rank B involves the largest thickness error of approximately 4% at the maximum. The green sheet of the rank E involves the smallest error, but nevertheless an error of approximately 1% at the maximum may be involved.

In a case where the thickness measurement itself may involve an error of approximately a few μm, even if the above-described classification is performed based on the measurement value, it is sufficiently likely that a true value of the thickness of the green sheet actually classified is different from a value intended in each rank, because the certainty of the measurement value itself is insufficient. Accordingly, it is substantially impossible to perform the ranking, unless the ranking is based on a measurement result obtained by the measuring equipment 10 described above.

The classification of the green sheet S may be performed by an operator of the measuring equipment 10 checking a measurement result against the ranking criteria. Alternatively, in another possible mode, the computer 5 stores in advance the ranking criteria shown in FIG. 4, and the measuring equipment 10 identifies the rank of the green sheet S based on a measurement result, and then the operator performs the classification based on an identification result. Alternatively, in still another possible mode, the measuring equipment 10 itself automatically transports the green sheet S to any of storage spaces corresponding to the respective ranks.

The ranking is performed for many green sheets as described above, and then the laminated body is formed. Specifically, the rank of the green sheet S usable for each layer of the laminated body is identified, and the lamination is performed using only the green sheet S belonging to the rank allowed for each layer (step S4). However, if printing of a circuit pattern, formation of a cavity, and the like, are necessary in advance, they are performed and then the lamination is performed.

For example, if the green sheet S on which an electrode pattern or the like is printed has a large thickness variation, the film thickness of the formed electrode pattern also has a large variation, which greatly affects device characteristics. Therefore, it is conceivable that a green sheet S belonging to the rank in which an allowable range of the thickness variation is set small will be subjected to such printing.

FIG. 5 illustrates a rank of the green sheet S allowed to be used for each of the first to sixth layers of the laminated body, and a range of a possible thickness of any position of the green sheet S used for each layer, in a case where the green sheet S is ranked as shown in FIG. 4.

In an example shown in FIG. 5, green sheets S allowed to be used as the first layer, the third layer, and the fifth layer are the green sheets S of the A, C, and E ranks, respectively, in which the variations are relative small. These layers are layers constituting an auxiliary-electrode-printed layer, an electrode-printed layer, and a heating-element-printed layer of the sensor element, respectively, and therefore green sheets S on which a printing process has been performed are used in a lamination. On the other hand, green sheets allowed to be used as the second layer, the fourth layer, and the sixth layer are not only the green sheets of the E, C, and A ranks, respectively, but also green sheets of the F, D, and B ranks, respectively, in which the variations are larger than in the E, C, and A ranks. Which of the green sheets S of the larger-variation ranks and the green sheets S of the smaller-variation ranks is to be preferentially used as the second layer, the fourth layer, and the sixth layer may be appropriately determined in view of a status of the ranking (such as which of the ranks contains more sheets).

If a laminated body is constituted under these conditions, as shown in FIG. 5, the thickness of the entire laminated body is between 1485.4 µm to 1635.0 µm. As described above, since the target thickness of each green sheet S is 255.0 µm, the target thickness of the entire laminated body is 1560 µm. Thus, the fact that the thickness of the laminated body is within the aforementioned range means that an error of the thickness of the laminated body is within a range of −5.0% to +4.8% of the target thickness. Consequently, an error per one green sheet S is smaller than ±1%.

If the same thickness accuracy is required for all the green sheets S in the lamination, it is necessary that an error of the thickness of each green sheet S is within ±1.0% of 255 µm. In this case, a very severe process control is required in a green sheet preparation process. Moreover, since a green sheet having an error of more than 1% cannot be used, an improvement in a yield rate is limited.

In this preferred embodiment, on the other hand, a variation allowed in an individual green sheet S is up to approximately 4% in a certain rank, as described above. In the latter case, an allowable range of the average thickness is large, and moreover an allowable variation is large. Therefore, the green sheets can be used at a high yield rate without the severe process control.

Basically, in a case where a thickness measurement accuracy itself may involve an error of a few µm, it is impossible to exactly recognize whether a variation of the thickness of the green sheet is suppressed to a few µm or smaller. In this respect as well, it can be stated that the process on the green sheet S in the lamination according to this preferred embodiment is substantially impossible unless it is based on a measurement result obtained by the above-described measuring equipment 10.

While the invention has been shown and described in detail, the foregoing description is in all aspects illustrative and not restrictive. It is therefore understood that numerous modifications and variations can be devised without departing from the scope of the invention.

What is claimed is:

1. An equipment which measures the thickness of a ceramic green sheet, comprising:
    a stage on which a ceramic green sheet is placed, and which has one or more openings;
    one or more measurement bases each arranged in each of said one or more openings; and
    one or more measuring elements which measure the thickness of said ceramic green sheet,
    wherein
    said one or more measurement bases are fixedly provided independently of said stage,
    an upper surface of said one or more measurement bases is at substantially the same height as said stage,
    each of said one or more measuring elements measures the thickness of said ceramic green sheet at a position thereof located above one of said one or more measurement bases in each of said one or more openings, said measurement being performed setting a height position of said measurement base as a reference position.

2. The measuring equipment according to claim 1, wherein
    said stage is provided so as to be movable along a predetermined movement direction by a drive mechanism,
    each of said one or more openings has a shape following said movement direction,
    in each of said one or more openings, each of said one or more measuring elements repeatedly performs the measurement while said stage is intermittently or continuously moved along said movement direction, and thereby, measures the thickness of said ceramic green sheet at a plurality of positions thereof.

3. The measuring equipment according to claim 2, wherein
    said one or more openings comprise a plurality of openings,
    said one or more measuring elements comprise a plurality of measuring elements each provided so as to correspond to each of said plurality of openings.

4. The measuring equipment according to claim 1, wherein
    said one or more measuring elements are digital gauges of contact type which measure the thickness of said ceramic green sheet,
    the thickness of said green sheet is measured by pinching said green sheet between an end of each of said digital gauges and corresponding one of said measurement bases.

5. The measuring equipment according to claim 4, wherein
    said one or more openings comprise a plurality of openings,
    each of said digital gauges is provided so as to correspond to each of said plurality of openings.

6. A method for forming a laminated body of ceramic green sheets, comprising the steps of:
    (a) setting ranking criteria for a ceramic green sheet, said ranking criteria defining a plurality of ranks based on an average thickness and a variation serving as reference values;
    (b) setting, from said plurality of ranks, a rank of a ceramic green sheet allowed to be used for each layer of the laminated body;
    (c) preparing a plurality of ceramic green sheets;
    (d) measuring the thickness of each of said plurality of ceramic green sheets, at a plurality of positions thereof;
    (e) classifying each of said plurality of ceramic green sheets into any of said plurality of ranks;
    (f) selecting, from said plurality of ceramic green sheets, a plurality of laminating ceramic green sheets which are used to constitute said layers of said laminated body; and
    (g) constituting said laminated body by using said plurality of laminating ceramic green sheets,
    wherein
    in said step (e), each ceramic green sheet is classified by checking an average and a variation of thickness measurement values obtained in said step (d) against said ranking criteria,
    in said step (g), each of said plurality of laminating ceramic green sheets is selected froth said plurality of ceramic green sheets classified in said step (e), in accordance with the setting of step (b).

7. The method for forming a laminated body according to claim 6, wherein in said step (d), the thickness of each of said plurality of ceramic green sheets is measured at said plurality of positions thereof, by using a measuring equipment comprising:
  a stage on which a measurement ceramic green sheet is placed, and which has a plurality of openings;
  a plurality of measurement bases each arranged in each of said plurality of openings; and
  a plurality of measuring elements which measure the thickness of said measurement ceramic green sheet, wherein
said plurality of measurement bases are fixedly provided independently of said stage,
said stage is provided so as to be movable along a predetermined movement direction by a drive mechanism
each of said plurality of openings has a shape following said movement direction,
an upper surface of said plurality of measurement bases is at substantially the same height as said stage,
each of said plurality of measuring elements measures the thickness of said measurement ceramic green sheet at a position thereof located above one of said plurality of measurement bases in each of said plurality of openings, said measurement being performed setting a height position of said measurement base as a reference position,
in each of said plurality of openings, each of said plurality of measuring elements repeatedly performs the measurement while said stage is intermittently or continuously moved along said movement direction, and thereby, measures the thickness of said measurement ceramic green sheet at a plurality of positions thereof.

8. The method for forming a laminated body according to claim 6, wherein
  in said step (b), with respect to a layer on which a pattern will be formed among said layers of said laminated body, a rank of a ceramic green sheet allowed to be used is set from, among said plurality of ranks, only the rank in which an allowable range of a variation of the thickness of the ceramic green sheet is set relatively small.

9. The method for forming a laminated body according to claim 8, wherein
  said laminated body is a sensor element for a gas sensor,
  said ceramic green sheet is a green sheet of solid electrolyte ceramic,
  in said step (b), with respect to at least a layer on which a printing pattern will be formed among a plurality of layers constituting said sensor element, a rank of a ceramic green sheet allowed to be used is set from, among said plurality of ranks, only the rank in which an allowable range of a variation of the thickness of the ceramic green sheet is set relatively small.

10. The method for forming a laminated body according to claim 7, wherein
  each of said plurality of measuring elements is a digital gauge of contact type which measures the thickness of said ceramic green sheet.

* * * * *

UNITED STATES PATENT AND TRADEMARK OFFICE
CERTIFICATE OF CORRECTION

PATENT NO. : 8,359,761 B2
APPLICATION NO. : 12/907130
DATED : January 29, 2013
INVENTOR(S) : Hiroyuki Shindo and Toyohiko Asai It is certified that error appears in the above-identified patent and that said Letters Patent is hereby corrected as shown below:

In the Claims:

Column 8, line 63

(claim 6, line 26): Please change "froth" to -- from --

Signed and Sealed this
Seventh Day of May, 2013

Teresa Stanek Rea
*Acting Director of the United States Patent and Trademark Office*